(12) United States Patent
Sirasao et al.

(10) Patent No.: US 10,984,500 B1
(45) Date of Patent: *Apr. 20, 2021

(54) INLINE IMAGE PREPROCESSING FOR CONVOLUTION OPERATIONS USING A MATRIX MULTIPLIER ON AN INTEGRATED CIRCUIT

(71) Applicant: Xilinx, Inc., San Jose, CA (US)

(72) Inventors: Ashish Sirasao, San Jose, CA (US); Elliott Delaye, San Jose, CA (US); Aaron Ng, San Jose, CA (US); Ehsan Ghasemi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/576,365

(22) Filed: Sep. 19, 2019

Related U.S. Application Data

(63) Continuation of application No. 15/786,244, filed on Oct. 17, 2017, now Pat. No. 10,460,416.

(51) Int. Cl.
  *G06T 1/20* (2006.01)
  *H03K 19/1776* (2020.01)
  (Continued)

(52) U.S. Cl.
  CPC .............. *G06T 1/20* (2013.01); *G06F 3/03* (2013.01); *G06T 1/60* (2013.01); *H03K 19/1776* (2013.01);
  (Continued)

(58) Field of Classification Search
  CPC ... G06T 1/20; G06T 1/60; G06F 12/00; G06F 12/02; G06F 12/0207; G06F 12/0223;
  (Continued)

(56) References Cited

U.S. PATENT DOCUMENTS

| 6,346,825 B1 | 2/2002 | Pang et al. |
| 2004/0054877 A1* | 3/2004 | Macy, Jr. ............ G06F 9/30036 712/221 |

(Continued)

OTHER PUBLICATIONS

Akesson, Benny, "An introduction to SDRAM and memory controllers," downloaded Sep. 25, 2017 from http://www.es.ele.tue.nl/premadona/files/akesson01.pdf, pp. 1-30, Eindhoven University of Technology, Eindhoven, The Netherlands.

(Continued)

*Primary Examiner* — Diane M Wills
(74) *Attorney, Agent, or Firm* — Patterson + Sheridan, LLP

(57) ABSTRACT

An example preprocessor circuit for formatting image data into a plurality of streams of image samples includes: a plurality of memory banks configured to store the image data; multiplexer circuitry coupled to the memory banks; a first plurality of registers coupled to the multiplexer circuitry; a second plurality of registers coupled to the first plurality of registers, outputs of the second plurality of registers configured to provide the plurality of streams of image samples; bank address and control circuitry coupled to control inputs of the plurality of memory banks, the multiplexer circuitry, and the first plurality of registers; output control circuitry coupled to control inputs of the second plurality of registers; and a control state machine coupled to the bank address and control circuitry and the output control circuitry.

20 Claims, 13 Drawing Sheets

(51) Int. Cl.
*G06F 3/03* (2006.01)
*G06T 1/60* (2006.01)
*H04N 21/2381* (2011.01)
*H04N 5/30* (2006.01)
*G06F 12/00* (2006.01)

(52) U.S. Cl.
CPC ........... *H04N 5/30* (2013.01); *H04N 21/2381* (2013.01); *G06F 12/00* (2013.01)

(58) Field of Classification Search
CPC .................. G06F 12/0284; G06F 3/03; G06F 2212/1016; G06F 2212/1044; G06F 2212/1056; G06F 2212/455; G06N 3/0454; G06N 3/063; H03K 19/1733; H03K 19/1737; H03K 19/177–17728; H03K 19/1776; H04N 21/2381; H04N 5/30

See application file for complete search history.

(56) References Cited

U.S. PATENT DOCUMENTS

| | | | | |
|---|---|---|---|---|
| 2008/0301418 A1* | 12/2008 | Khailany | ................ | G06F 8/453 712/227 |
| 2011/0026846 A1* | 2/2011 | Hsu | ........................ | H04N 19/60 382/250 |
| 2017/0249717 A1 | 8/2017 | Meixner et al. | | |

OTHER PUBLICATIONS

Chetlur, Sharan et al., "cuDNN: Efficient Primitives for Deep Learning," submitted Oct. 3, 2014, pp. 1-9, https://arxiv.org/pdf/1410.0759.pdf, Cornell University Library.

Di Carlo, Stefano et al., "An Area-Efficient 2-D Convolution Implementation on FPGA for Space Applications," Proc. of the 2011 IEEE 6th International Design & Test Workshop, Dec. 11, 2011, pp. 88-92, IEEE, Piscataway, New Jersey, USA.

Gysel, Philipp, "Ristretto: Hardware-Oriented Approximation of Convolutional Neural Networks," May 20, 2016, pp. 1-73, https://arxiv.org/abs/1605.06402, Cornell University Library.

Khronos, "clSetKernelArg," downloaded Sep. 22, 2017 from https://www.khronos.org/registry/OpenCL/sdk/1.0/docs/man/xhtml/clSetKernelArg.html, copyright 2007, pp. 1-4, Khronos Group, Beaverton, Oregon, USA.

Krizhevsky, Alex et al., "ImageNet Classification with Deep Convolutional Neural Networks," Proc. of the 12th International Conference on Neural Processing Systems, Dec. 3, 2012, pp. 1097-1105, ACM Digital Library, www.acm.org.

Mathworks, "im2col," dowloaded Sep. 22, 2017 from https://www.mathworks.com/help/images/ref/im2col.html?searchHighlight=im2col&s_tid=doc_srchtitle, pp. 1-3.

Saxena, Abhineet, "Convolutional Neural Networks (CNNs): An Illustrated Explanation," Jun. 20, 2016, downloaded Sep. 25, 2017 from http://xrds.acm.org/blog/2016/06/convolutional-neural-networks-cnns-illustrated-explanation/, pp. 1-15.

Shaaban, Muhammed, "Systolic Architectures," Mar. 11, 2003, Kate Gleason College of Engineering, Rochester Institute of Technology, Rochester, New York, USA.

Stanford, "CS231n Convolutional Neural Networks for Visual Recognition," downloaded Sep. 25, 2017 from http://cs231n.stanford.edu/, pp. 1-23, Stanford University, Stanford, California, USA.

Warden, Pete, "Why GEMM is at the heart of deep learning," Apr. 20, 2015, pp. 1-9, downloaded from https://petewarden.com/2015/04/20/why-gemm-is-at-the-heart-of-deep-learning/.

Wikipedia, "Convolutional neural network," Sep. 20, 2017, pp. 1-13, downloaded from https://en.wikipedia.org/wiki/Convolutional_neural_network.

Wikipedia, "Deep learning," Sep. 24, 2017, pp. 1-13, downloaded from https://en.wikipedia.org/wiki/Deep_learning.

Wikpedia, "Matrix Multiplication," Sep. 20, 2017, pp. 1-19, downloaded from https://en.wikipedia.org/wiki/Matrix_multiplication.

Wikipedia, "Multiprocessing," May 10, 2017, pp. 1-4, dowloaded from https://en.wikipedia.org/wiki/Multiprocessing.

Wikipedia, "Producer-consumer problem," Sep. 7, 2017, pp. 1-9, downloaded from https://en.wikipedia.org/wiki/Producer%E2%80%93consumer_problem.

Wikipedia, "Row- and colum-major order," Aug. 23, 2017, pp. 1-5, downloaded from https://en.wikipedia.org/wiki/Row-_and_column-major_order.

Wikipedia, "Systolic array," Mar. 22, 2017, pp. 1-5, downloaded from https://en.wikipedia.org/wiki/Systolic_array.

Wikipedia, "Very long instruction word," Jul. 13, 2017, pp. 1-3, downloaded from https://en.wikipedia.org/wiki/Very_long_instruction_word.

Xilinx, "Smarter Data Center," downloaded Sep. 22, 2017 from https://www.xilinx.com/applications/data-center.html, pp. 1-4, Xilinx, Inc., San Jose, California, USA.

Xilinx, "SDSoC Development Environment," downloaded Sep. 22, 2017 from https://www.xilinx.com/products/design-tools/software-zone/sdsoc.html, pp. 1-16, Xilinx, Inc., San Jose, California, USA.

Xilinx, "UltraScale Architecture DSP Slice User Guide," UG579 (v1.3), Nov. 24, 2015, pp. 1-74, Xilinx, Inc., San Jose, California, USA.

Xilinx, "Vivado High-Level Synthesis," downloaded Sep. 22, 2017 from https://www.xilinx.com/products/design-tools/vivado/integration/esl-design.html, pp. 1-2, Xilinx, Inc., San Jose, California, USA.

Xilinx, "Deep Learning with INT8 Optimization on Xilinx Devices," WP486 (v1.0.1), Apr. 24, 2017, pp. 1-11, Xilinx, Inc., San Jose, California, USA.

Xilinx, "Implementing Memory Structures for Video Processing in the Vivado HLS Tool," XAPP793 (v1.0), Sep. 20, 2012, pp. 1-8, Xilinx, Inc., San Jose, California, USA.

Xilinx, "Two-Dimensional Linear Filtering," XAPP933 (v1.1), Oct. 23, 2007, pp. 1-8, Xilinx, Inc., San Jose, Califomia, USA.

Unnikrishnan K et al., "Parallel Computation Using DSP Slices in FPGA", Procedia Technology, 2015.

\* cited by examiner

1200

| (0,0) | (0,1) | (0,2) | (0,3) | (0,4) |
|---|---|---|---|---|
| (1,0) | (1,1) | (1,2) | (1,3) | (1,4) |
| (2,0) | (2,1) | (2,2) | (2,3) | (2,4) |
| (3,0) | (3,1) | (3,2) | (3,3) | (3,4) |
| (4,0) | (4,1) | (4,2) | (4,3) | (4,4) |

| (0,0) | (0,1) | (0,2) | (1,0) | (1,1) | (1,2) | (2,0) | (2,1) | (2,2) |
|---|---|---|---|---|---|---|---|---|
| (0,1) | (0,2) | (0,3) | (1,1) | (1,2) | (1,3) | (2,1) | (2,2) | (2,3) |
| (0,2) | (0,3) | (0,4) | (1,2) | (1,3) | (1,4) | (2,2) | (2,3) | (2,4) |
| (1,0) | (1,1) | (1,2) | (2,0) | (2,1) | (2,2) | (3,0) | (3,1) | (3,2) |
| (1,1) | (1,2) | (1,3) | (2,1) | (2,2) | (2,3) | (3,1) | (3,2) | (3,3) |
| (1,2) | (1,3) | (1,4) | (2,2) | (2,3) | (2,4) | (3,2) | (3,3) | (3,4) |
| (2,0) | (2,1) | (2,2) | (3,0) | (3,1) | (3,2) | (4,0) | (4,1) | (4,2) |
| (2,1) | (2,2) | (2,3) | (3,1) | (3,2) | (3,3) | (4,1) | (4,2) | (4,3) |
| (2,2) | (2,3) | (2,4) | (3,2) | (3,3) | (3,4) | (4,2) | (4,3) | (4,4) |

| Bank 0 | Bank 1 | Bank 2 | Bank 3 |
|---|---|---|---|
| (0,0) | (0,1) | (0,2) | (0,3) |
| (0,4) | (1,0) | (1,1) | (1,2) |
| (1,3) | (1,4) | (2,0) | (2,1) |
| (2,2) | (2,3) | (2,4) | (3,0) |
| (3,1) | (3,2) | (3,3) | (3,4) |
| (4,0) | (4,1) | (4,2) | (4,3) |
| (4,4) | 0 | 0 | 0 |

| (0,0) | (0,1) | (0,2) | (1,0) |
|---|---|---|---|

| {0,0,1,1} | {0,1,1,1} | {0,2,1,1} | {-,-,-,0} | Valid = 0 |
|---|---|---|---|---|
| {-,-,-,0} | {1,1,1,1} | {-,-,-,0} | {-,-,-,0} | Valid = 1 |

FIG. 17

INLINE IMAGE PREPROCESSING FOR CONVOLUTION OPERATIONS USING A MATRIX MULTIPLIER ON AN INTEGRATED CIRCUIT

CROSS-REFERENCE TO RELATED APPLICATIONS

This application is a continuation of U.S. patent application Ser. No. 15/786,244, which is incorporated by reference herein.

TECHNICAL FIELD

Examples of the present disclosure generally relate to computing systems and electronic circuits and, in particular, to inline image preprocessing for convolution operations using a matrix multiplier on an integrated circuit (IC).

BACKGROUND

Machine learning is the science of inducing computing systems to act without being explicitly programmed. Classical machine learning includes various clustering and classification techniques; including K-means clustering, linear and logistic regressions, stochastic gradient decent, association rule learning, and the like. Deep learning is a newer frontier in machine learning. Deep learning is a class of machine learning algorithms that uses multiple layers of nonlinear processing units for feature extraction and transformation. Deep learning algorithms can be unsupervised (e.g., pattern analysis) or supervised (e.g., classification). The deep learning algorithm can be implemented using layers of an artificial neural network (ANN) (referred to herein as a "neural network").

In general, a neural network is a collection of nodes (i.e., the "neurons") that are connected in a graph. A node in a neural network computes a sum of weighted inputs and adds an optional bias to the sum. The output of the node is a function of the final sum (referred to as an "activation function"). Example activation functions include the sigmoid function, the hyperbolic tangent (tank) function, the Rectified Linear Unit (ReLU) function, and the identity function. Neural network models are often organized into layers of nodes, which define a specific topology, and corresponding weights and biases. The weights and biases are referred to as network parameters.

In general, a neural network includes an input layer and an output layer and can optionally include one or more hidden layers between the input and output layers. A neural network used in deep learning applications typically includes many hidden layers, which gives rise to the term deep neural network (DNN). The layers of a neural network can be densely connected (e.g., each node in a layer is fully connected to all nodes in a previous layer) or sparsely connected (e.g., each node in a layer is connected to only a portion of the nodes in a previous layer). A convolutional neural network (CNN) is a type of DNN that includes one or more sparsely connected layers, referred to as convolutional layers. A CNN is well-suited for processing image or video data. Other types of DNNs include recurrent neural network (RNNs), which are well-suited for processing speech and text data.

Convolution operations can be performed using a number of techniques, which are typically limited by the ability to use a large number of digital signal processors (DSPs), the requirement of on-chip buffers, and/or the data access patterns. One example convolution technique creates a shift register of samples that are fed into a DSP array. This technique is limited in terms of not being able to use striding or dilated convolutions in which the convolution window skips columns and rows in the input image. This is due to a conflict between use of the shift registers to cycle through samples in sequence and the stride or dilation that skips or jumps samples in the input image. Accordingly, it is desirable to provide an improved architecture to compute parallel generalized convolutions.

SUMMARY

Techniques for image preprocessing are described. In an example, preprocessor circuit for formatting image data into a plurality of streams of image samples includes: a plurality of memory banks configured to store the image data; multiplexer circuitry coupled to the memory banks; a first plurality of registers coupled to the multiplexer circuitry; a second plurality of registers coupled to the first plurality of registers, outputs of the second plurality of registers configured to provide the plurality of streams of image samples; bank address and control circuitry coupled to control inputs of the plurality of memory banks, the multiplexer circuitry, and the first plurality of registers; output control circuitry coupled to control inputs of the second plurality of registers; and a control state machine coupled to the bank address and control circuitry and the output control circuitry.

In another example, an integrated circuit (IC) includes: a memory controller configured to access a memory having image data stored therein; an image preprocessor, coupled to the memory controller, configured to obtain the image data and generate a plurality of streams of image samples from the image data; and a processor, coupled to the image preprocessor, configured to process the plurality of streams of image samples. The image preprocessor includes: a plurality of memory banks configured to store the image data; multiplexer circuitry coupled to the plurality of memory banks; a first plurality of registers coupled to the multiplexer circuitry; a second plurality of registers coupled to the first plurality of registers, outputs of the second plurality of registers configured to provide the plurality of streams of image samples; and bank address and control circuitry coupled to control inputs of the plurality of memory banks, the multiplexer circuitry, and the first plurality of registers; output control circuitry coupled to control inputs of the second plurality of registers; and a control state machine coupled to the bank address and control circuitry and the output control circuitry.

In another example, a method of controlling an image preprocessor that formats image data into a plurality of streams of image samples includes: generating control data based on an input image size, a kernel size, a stride, and a padding value for a convolutional layer of a neural network; loading image data to a plurality of memory banks of the image preprocessor; loading the control data to a control state machine coupled to the bank address and control circuitry and the output control circuitry, the bank address and control circuitry coupled to control inputs of the plurality of memory banks, the first plurality of multiplexers, the second plurality of multiplexers, and the first plurality of registers, the output control circuitry coupled to control inputs of the second plurality of registers; controlling, by the control state machine, the bank address and control circuitry to generate addresses for the plurality of memory banks, control multiplexer circuitry to select among outputs of the plurality of memory banks, control a first plurality of registers to store outputs of the multiplexer circuitry; controlling, by the control state machine, the output control circuitry to control a second plurality of registers to store outputs of the first plurality of registers; and generating the plurality of streams of image samples from output of the second plurality of registers.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 12 depicts a table representing addresses of a 2D image according to an example.

FIG. 13 depicts a table representing addresses of the image data transformed according to an image-to-column (im2col) operation according to an example.

FIG. 14 depicts a table showing an image stored in memory banks of an image preprocessor according to an example.

FIG. 16 depicts a subarray selected from an image-to-column array according to an example.

FIG. 17 depicts a table showing control information generated for an image preprocessor according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
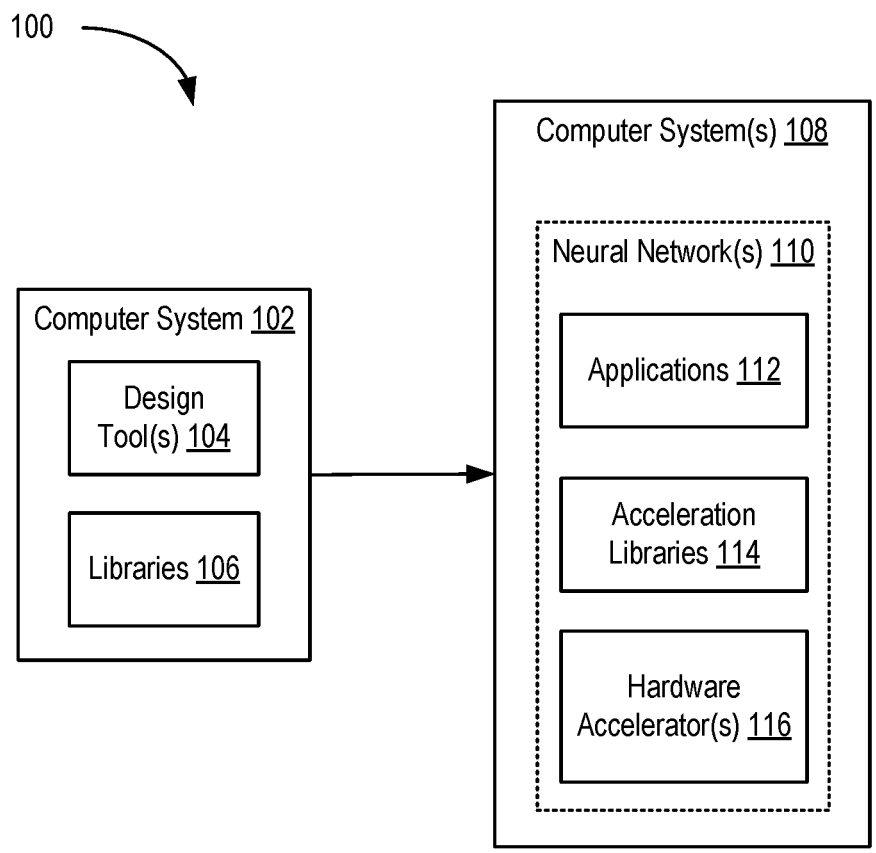
FIG. 1 is a block diagram depicting a system for implementing neural networks according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for image preprocessing are described. An image preprocessor includes an architecture of multiplexers, buffers, and shift registers that can generate a large number of data samples every clock cycle to perform image processing operations, such as convolution. The architecture supports strided or dilated access patterns of the input image data. The architecture allows for implementation of image processing, such as convolution, using a large systolic array, which is particularly useful for implementing convolutional neural networks (CNNs). For convolution, the architecture balances the memory latency of reading the input image against the convolutional size in order to make the convolution run at maximum efficiency with minimal buffers, minimal levels of logic, and reducing memory bandwidth. The architecture also supports various convolutional filter sizes with minimal area penalty, which is advantageous for CNNs that change convolutional filter sizes dynamically. These and further aspects of the architecture are described below with respect to the drawings.

FIG. 1 is a block diagram depicting a system 100 for implementing neural networks according to an example. The system 100 includes a computer system 102 and one or more computer systems 108. The computer system 102 includes conventional computing components configured to execute software that provides one or more design tools 104. Each computer system 108 executes one or more neural networks 110. The neural network(s) 110 are implemented using applications 112, acceleration libraries 114, and one or more hardware accelerators 116.

In an example, the hardware accelerator(s) 116 include programmable integrated circuits (ICs), such as field programmable gate arrays (FPGAs). The acceleration libraries 114 provide application programming interfaces (APIs) to interface with the hardware accelerator(s) 116. The acceleration libraries 114 can also include libraries that provide neural network functions, including predefined and optimized implementations of neural network layers and other types of neural network structures. Thus, the neural network(s) 110 can include both hardware portions implemented in the hardware accelerator(s) 116, as well as software portions implemented in the acceleration libraries 114. The applications 112 invoke the APIs of the acceleration libraries 114 to program and control the hardware accelerator(s) 116 to implement the neural network(s) 116.

A designer interacts with the design tool(s) 104 to define the neural network(s) 110. The design tool(s) 104 can generate files for programming the hardware accelerator(s) 116 (e.g., configuration bitstreams for FPGAs), files that provide the acceleration libraries 114, and files that provide the applications 112. The designer can define the hardware portions of the neural network(s) 110 using a register transfer language (RTL) or using a programming language, such as C, C++, OpenCL, and the like, or a combination of RTL and programmable language(s). The user can define the software portions of the neural network(s) 110 using a programming language, such as C, C++, OpenCL, etc. The design tool(s) 104 compile the software-defined neural networks to generate files for programming the hardware accelerator(s) 116 and library files for the acceleration libraries 114. The designer can make use of libraries 106 that provide class libraries, template libraries, and the like to assist in developing the hardware and software portions of the neural network(s) 110.

A user can define the applications 112 using a programming language (e.g., C, C++, Python, etc.). The user can make use of neural network frameworks and libraries, such as Caffe, TensorFlow, MXNet, and the like.

Figure 2:
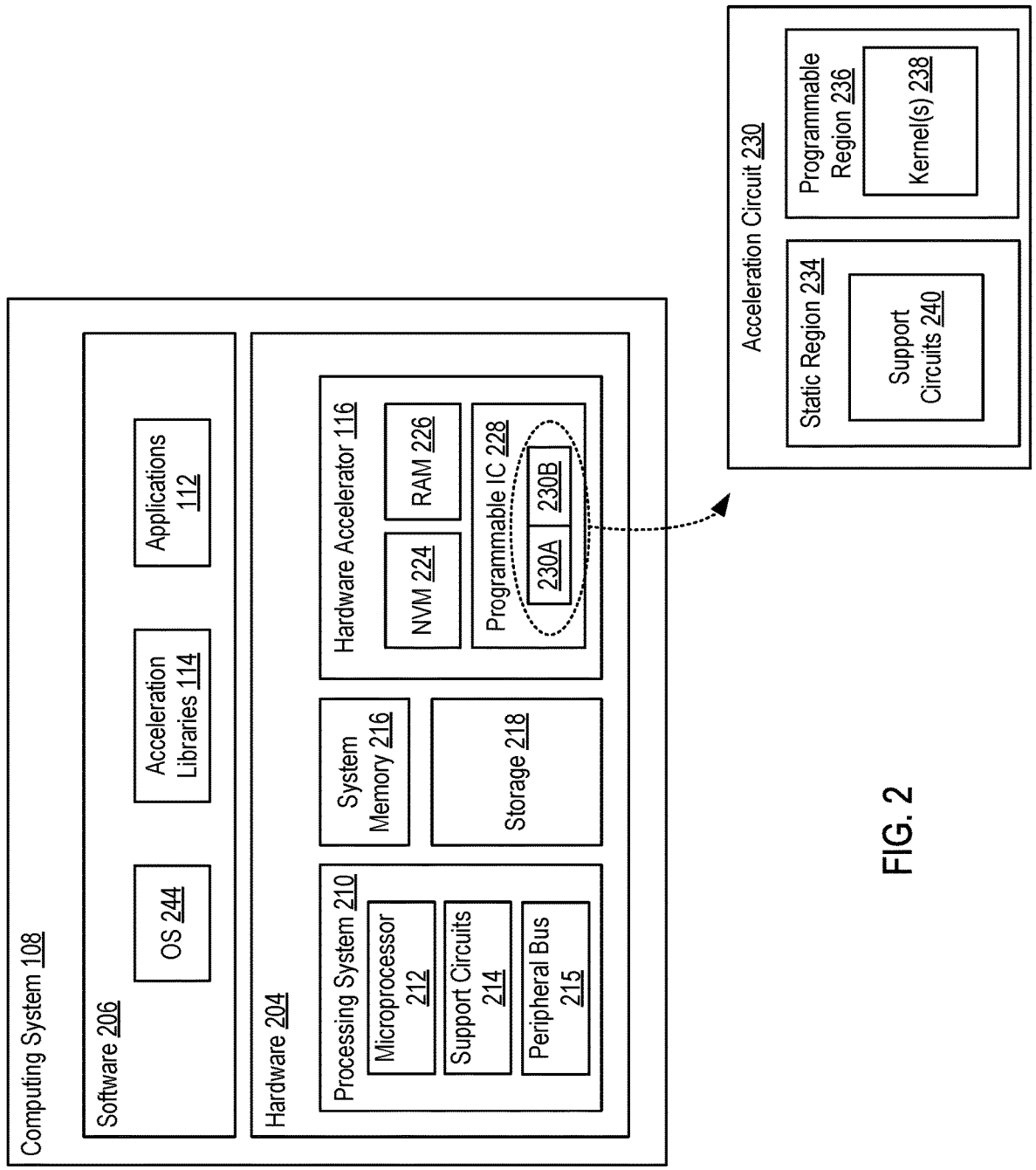
FIG. 2 is a block diagram depicting a computing system according to an example.

FIG. 2 is a block diagram depicting a computing system 108 according to an example. The computing system 108 includes hardware 204 and software 206 executing on the hardware 204. The hardware 204 includes a processing system 210, system memory 216, storage devices ("storage 218"), and a hardware accelerator 116. The software 206 includes an operating system (OS) 244, the acceleration libraries 114, and the applications 112.

The processing system 210 includes a microprocessor 212, support circuits 214, and a peripheral bus 215. The microprocessor 212 can be any type of general-purpose central processing unit (CPU), such as an x86-based processor, ARM®-based processor, or the like. The microprocessor 212 can include one or more cores and associated circuitry (e.g., cache memories, memory management units (MMUs), interrupt controllers, etc.). The microprocessor 212 is configured to execute program code that perform one or more operations described herein and which can be stored in the system memory 216 and/or the storage 218. The support circuits 214 include various devices that cooperate with the microprocessor 212 to manage data flow between the microprocessor 212, the system memory 216, the storage 218, the hardware accelerator 116, or any other peripheral device. For example, the support circuits 214 can include a chipset (e.g., a north bridge, south bridge, platform host controller, etc.), voltage regulators, firmware (e.g., a BIOS), and the like. The support circuits 214 manage data flow between the microprocessor 212 and the peripheral bus 215, to which various peripherals, such as the hardware accelerator 116, are connected. In some examples, the microprocessor 212 can be a System-in-Package (SiP), System-on-Chip (SoC), or the like, which absorbs all or a substantial portion of the functionality of the chipset (e.g., north bridge, south bridge, etc.). The peripheral bus can implement an expansion bus standard, such as Peripheral Component Interconnect Express (PCIe). In the example, the processing system 210 is shown separate from the hardware accelerator 116. In other examples discussed further below, the processing system 210 and the hardware accelerator 116 can be implemented on the same integrated circuit (IC) using a System-On-Chip (SoC).

The system memory 216 is a device allowing information, such as executable instructions and data, to be stored and retrieved. The system memory 216 can include, for example, one or more random access memory (RAM) modules, such as double-data rate (DDR) dynamic RAM (DRAM). The storage device 218 includes local storage devices (e.g., one or more hard disks, flash memory modules, solid state disks, and optical disks) and/or a storage interface that enables the computing system 108 to communicate with one or more network data storage systems. The hardware 204 can include various other conventional devices and peripherals of a computing system, such as graphics cards, universal serial bus (USB) interfaces, and the like.

The hardware accelerator 116 includes a programmable IC 228, a nonvolatile memory 224, and RAM 226. The programmable IC 228 can be an FPGA or the like or an SoC having an FPGA or the like. The NVM 224 can include any type of nonvolatile memory, such as flash memory or the like. The RAM 226 can include DDR DRAM or the like. The programmable IC 228 is coupled to the NVM 224 and the RAM 226. The programmable IC 228 is also coupled to the peripheral bus 215 of the processing system 210.

The OS 244 can be any commodity operating system known in the art, such as such as Linux®, Microsoft Windows®, Mac OS®, or the like. The acceleration libraries 114 includes drivers and libraries that provide APIs for command and control of the hardware accelerator 116. The applications 112 include software executing on the microprocessor 212 that invokes the APIs of the acceleration libraries 114 to implement neural network(s).

In operation, the programmable IC 228 is configured with an acceleration circuit 230. The acceleration circuit 230 generally includes a base platform 230A and a kernel 230B. For example, the acceleration circuit 230 can be implemented using a static region 234 and a programmable region 236. The static region 234 includes support circuits 240 for providing an interface to the peripheral bus 215, the NVM 224, and the RAM 226. The programmable region 236 can include one or more kernel circuits ("kernel(s) 238"). The base platform 230A is implemented using the static region 234, and the kernel 230B is implemented using the programmable region 236. In another example, the base platform 230A can also be implemented using a portion of the programmable region 236. Thus, in some examples, the programmable region 236 also includes some interface circuits. In some examples, the acceleration circuit 230 can include more than one programmable region 236, each of which can be individually configured with kernel(s) 238.

The static region 234 is "static" in that the circuitry thereof remains constant across reconfigurations of the programmable region 236. In an example, the support circuits 240 include PCIe endpoint circuits, a direct memory access (DMA) controller, interconnects, a memory controller, a memory interface circuit (e.g., a DDR interface), decoupler circuits (to support partial reconfiguration), flash programmer, debug circuits, and the like. In some examples, the programmable region 236 does not include any of the support circuits 240. In other examples, some support circuits are implemented in the programmable region 236. In such case, the programmable region 236 can be referred to as an "expanded programmable region." In either case, in one example, some support circuits 240 are always present in the static region 234, such as the PCIe circuits and the DMA circuits.

Figure 3:
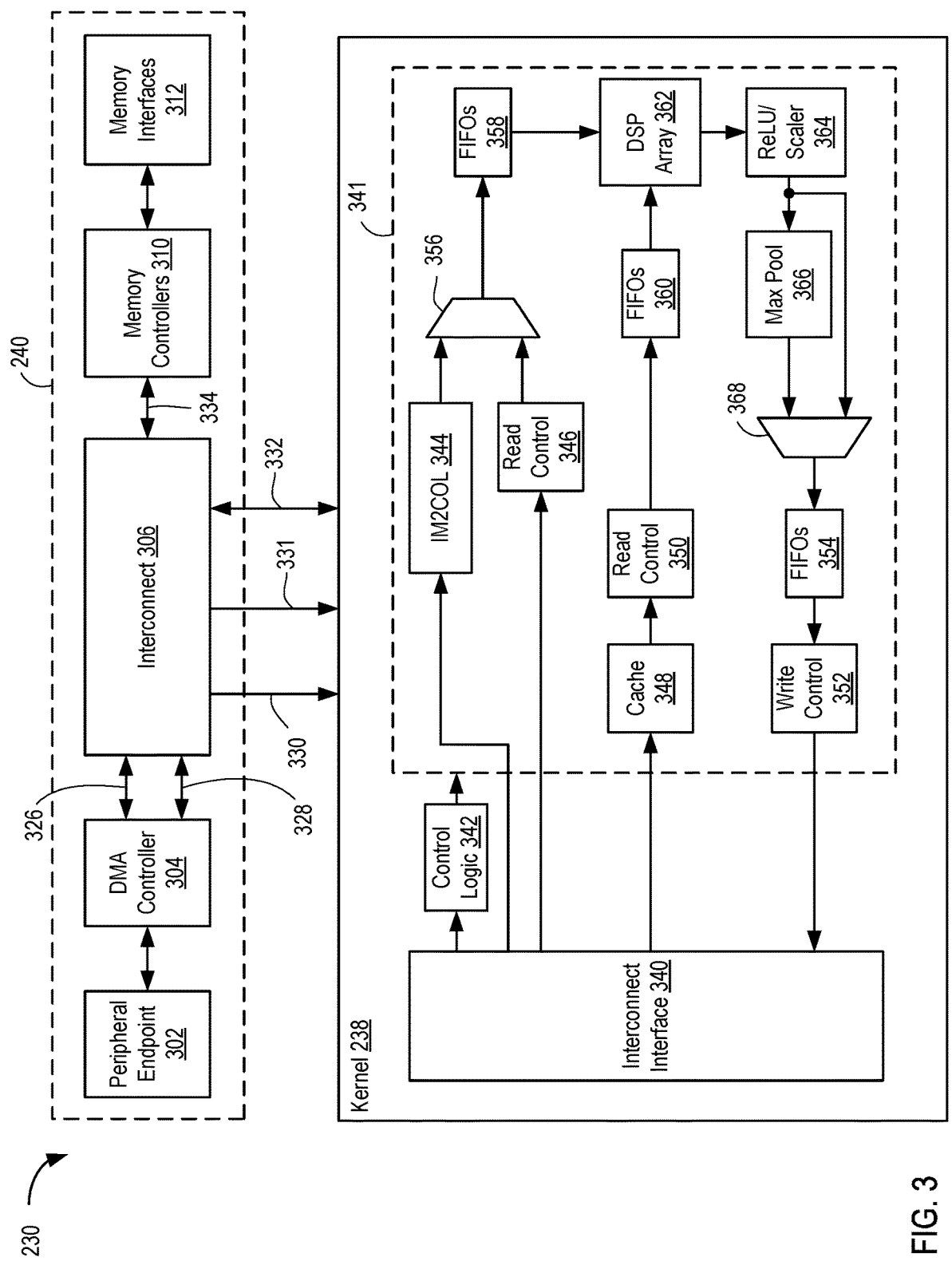
FIG. 3 is a block diagram depicting an acceleration circuit according to an example.

FIG. 3 is a block diagram depicting an acceleration circuit 230 according to an example. The acceleration circuit 230 includes the support circuits 240 and a kernel 238. In the example, the support circuits 240 include a PCIe endpoint circuit ("PCIe endpoint 302"), a PCIe DMA controller 304, interconnect circuits ("interconnect 306"), memory controllers 310, and memory interfaces 312. The support circuits 240 can include other circuits, which are omitted for clarity (e.g., decoupler circuits, debug circuits, etc.). The PCIe endpoint 302 provides a physical interface to the peripheral bus 215. The PCIe DMA controller 304 facilitates DMA operations to the RAM 226 and the kernel 238. The interconnect 306 couples the PCIe DMA controller 304 to the memory controllers 310 and to the kernel 238. The memory controllers 310 are coupled to the memory interfaces 312. The memory interfaces 312 are coupled to the RAM 226.

In operation, the acceleration libraries 114 can access the RAM 226 directly through the PCIe DMA controller 304. The acceleration libraries 114 can also access the kernel 238 through the PCIe DMA controller 304. The kernel 238 can access the RAM 226 through the memory controllers 310. Data can be exchanged between the software 206 and the kernel 238 using DMA operations between the system memory 216 and the RAM 226.

In the example, the kernel 238 uses interfaces 330, 331, and 332 to communicate with the interconnect 306. In particular, these interfaces include a first read interface 330, a second read interface 331, and a read/write interface 332. For example, the read interface 330 can be used as a control interface for controlling the kernel 238. The read interface 331 can be used to read from the RAM 226 through a first one of the memory interfaces 312. The read/write interface 332 can be used to read and write from the RAM 226 through a second one of the memory interfaces 312.

The kernel 238 includes an interconnect interface 304, control logic 342, and processing circuits 341. The processing circuits 341 include an IM2COL circuit ("IM2COL 344"), a read control circuit ("read control 346"), a multiplexer 356, first-in-first-out circuits ("FIFOs 358"), digital signal processor (DSP) array 362, a scaler circuit ("scaler 364"), a max pool circuit ("max pool 366"), a multiplexer 368, FIFOs 354, write control circuit ("write control 352"), a cache 348, a read control circuit ("read control 350"), and FIFOs 360. The interconnect interface 340 is coupled to the interfaces 330, 331, and 332, the control logic 342, and the processing circuits 341. The interconnect interface 340 can include switches, clock converters, and the like to facilitate communication between the control logic 342 and the interface 330, as well as between the processing circuits 341 and the interfaces 331 and 332.

In the example, the interconnect interface 340 is coupled to inputs of the IM2COL circuit 344, the read control circuit 346, the cache 348, and the write control circuit 352. Outputs of the IM2COL circuit 344 and the read control circuit 346 are coupled to inputs of the multiplexer 356. An output of the multiplexer 356 is coupled to an input of the FIFOs 358. An output of the FIFOs 358 is coupled to a first input of the DSP array 362. An output of the cache 348 is coupled to an input of the read control circuit 350. An output of the read control circuit 350 is coupled to an input of the FIFOs 360. An output of the FIFOs 360 is coupled to a second input of the DSP array 362. An output of the DSP array 362 is coupled to an input of the scaler 364. An output of the scaler 364 is coupled to an input of the max pool circuit 366 and an input of the multiplexer 368. An output of the max pool circuit 366 is coupled to another input of the multiplexer 368. An output of the multiplexer 368 is coupled to an input of the FIFOs 354. An output of the FIFOs 354 is coupled to the write control circuit 352.

In operation, the DSP array 362 performs matrix multiplication operations for implementing a neural network. The inputs of the DSP array 362 receive input activation matrices from the FIFOs 358 and weight matrices from the FIFOs 360. The input activation matrices can be read directly from the RAM 226 using the read control circuit 346. Alternatively, the input activations can be read from the RAM 226 and processed by the IM2COL circuit 344 for input to the DSP array 362. Embodiments of the IM2COL circuit 344 are described below. Weight matrices can be read from the RAM 226 by the read control circuit 350 and cached in cache 348. The scaler 364 can scale the output of the DSP array 362. The max pool circuit 366 can implement a max pooling function on the scaled output of the DSP array 362. In one example, the max pool circuit 966 is implemented using CLBs or other configurable logic. Either the output of the max pool circuit 366 or the scaler 364 can be stored in the FIFOs 354. The write control circuit 352 writes data in the FIFOs to the RAM 226. The control logic 342 controls the various circuits in the processing circuits 341, such as the IM2COL circuit 344, the read control circuit 346, the multiplexers 356 and 368, the read control circuit 350, and the scaler 364, the max pool circuit 366, and the write control circuit 352.

Figure 4:
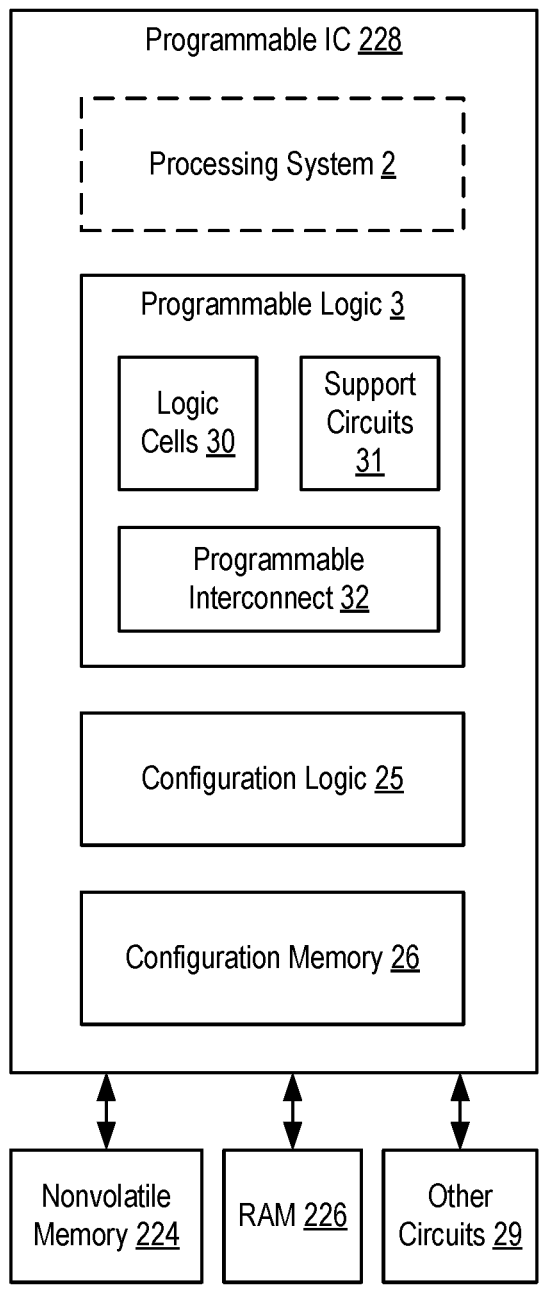
FIG. 4 is a block diagram depicting a programmable integrated circuit (IC) according to an example.

FIG. 4 is a block diagram depicting a programmable IC 228 according to an example. The programmable IC 228 includes programmable logic 3, configuration logic 25, and configuration memory 26. The programmable IC 228 can be coupled to external circuits, such as the NVM 224, the RAM 226, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 224 or any other source (e.g., the DRAM 28 or from the other circuits 29). In some examples, the programmable IC 228 includes a processing system 2. The processing system 2 can include microprocessor(s), memory, support circuits, IO circuits, and the like. For example, the processing system 2 can include circuits similar to the processing system 210. In some examples, the processing system 2 can be used in place of the processing system 210. In such case, the entire computing system 108 can be implemented using the programmable IC 228, where the software 206 executes on the processing system 2.

Figure 5:
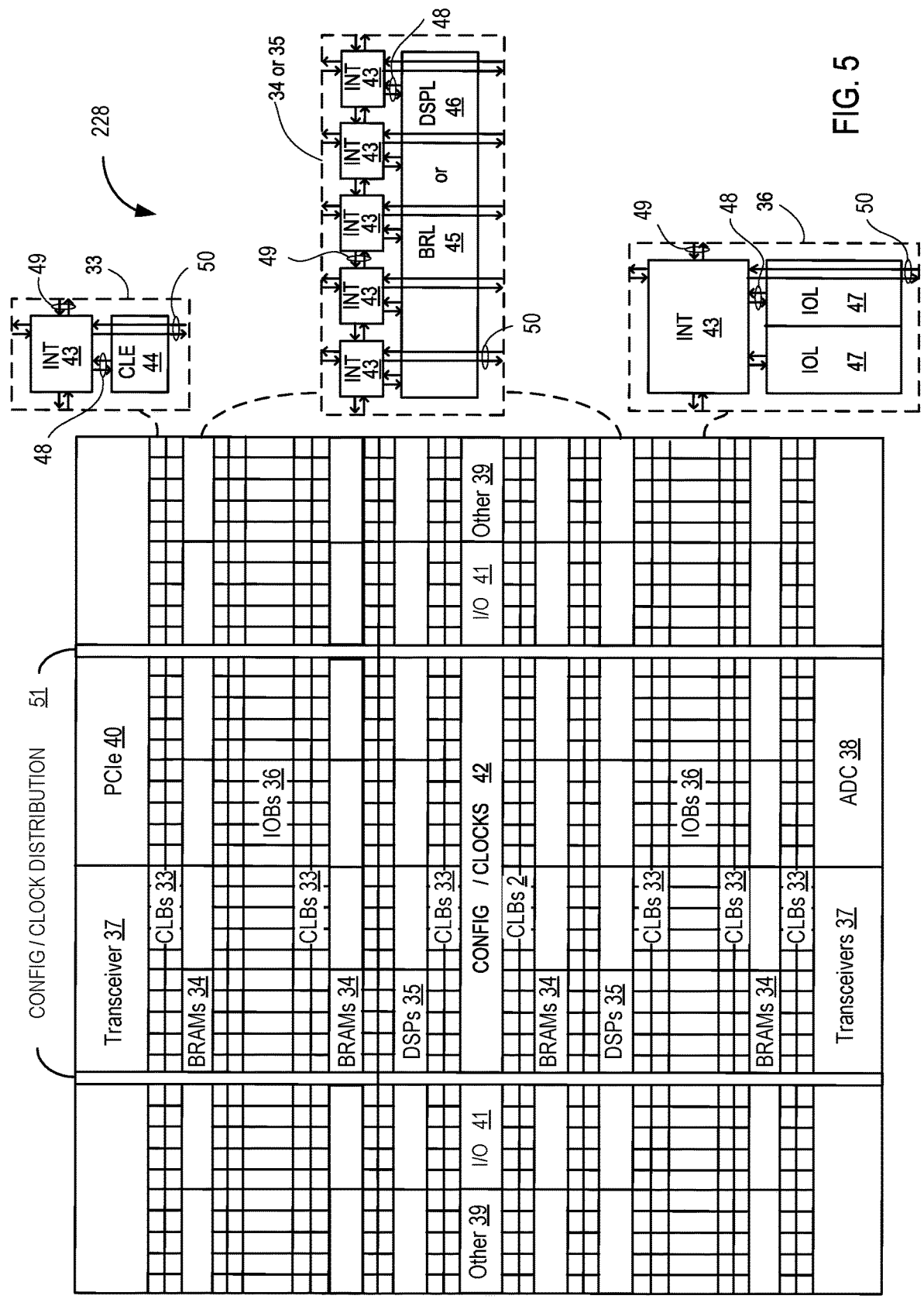
FIG. 5 illustrates a field programmable gate array (FPGA) implementation of a programmable IC according to an example.

FIG. 5 illustrates an FPGA implementation of the programmable IC 228 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 5. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 8) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Inline Image Preprocessing for Convolution Operations

Figure 6:
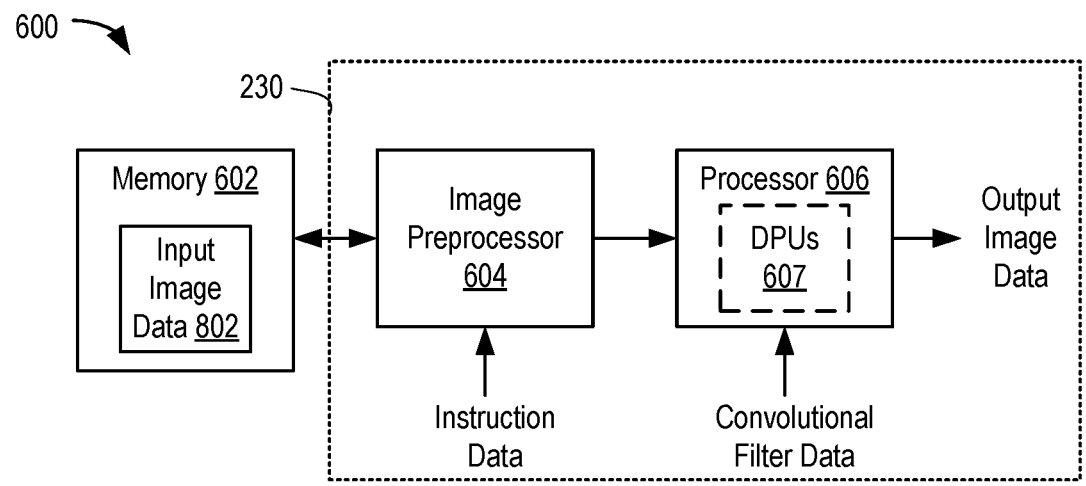
FIG. 6 is a block diagram depicting a convolution processor according to an example.

FIG. 6 is a block diagram depicting a convolution processor 600 according to an example. The convolution processor 600 includes a memory 602, an image preprocessor 604, and a processor 606. The image preprocessor 604 and the processor 606 can be implemented in the acceleration circuit 230 described above. For example, the processor 606 can be the DSP array 362. The image preprocessor 604 can be used in the IM2COL circuit 344. The memory 602 can be the RAM 226 in the hardware accelerator 116. An example structure of the image preprocessor 604 is described below with respect to FIG. 7. In other examples, the convolution processor 600 can be implemented in acceleration circuits or other types of circuits having different structures than shown in FIG. 3.

In operation, the memory 602 stores input image data 802 (also referred to as feature map data). Example input image data 802 is described below with respect to FIG. 8A. In general, the input image data 802 includes images, where each image is a two-dimensional array of samples. The image preprocessor 604 receives instruction data from an external circuit (e.g., the control logic 342). In response to the instruction data, the image preprocessor 604 obtains blocks of the image data 802 from the memory 602 and formats the image blocks into a plurality of parallel streams of image samples ("sample streams"). The image samples in each stream are ordered based on convolution parameters, including filter size, stride, and dilation. Convolution of image data is described briefly below, including the concepts of stride and dilation. The processor 606 receives the sample streams and convolutional filter data. The processor 606 performs operations resulting in convolution of the input image data 802 and the convolutional filter data. The processor 606 generates output image data as a result of the processing.

In an example, the processor 606 includes a systolic array of data processing units (DPUs) 607. As described further below, convolution can be performed using matrix multiplication. The DPUs 607 execute multiply-accumulate operations based on the sample streams and the filter data to generate the output image data. In other examples, the processor 606 can be a vector processor having one or more cores that process the sample streams and the filter data as vectors. In still other examples, the image preprocessor 604 can be coupled to other consumers of the image sample streams in addition to the processor 606 or as an alternative to the processor 606 (e.g., stored in a memory for later processing). In other examples, the processor 606 can perform other operations in place of convolution (e.g., filtering operations). In general, the image preprocessor 604 generates streams of image samples having certain sample patterns needed by the consumer of the image samples to perform particular operations.

Figure 7:
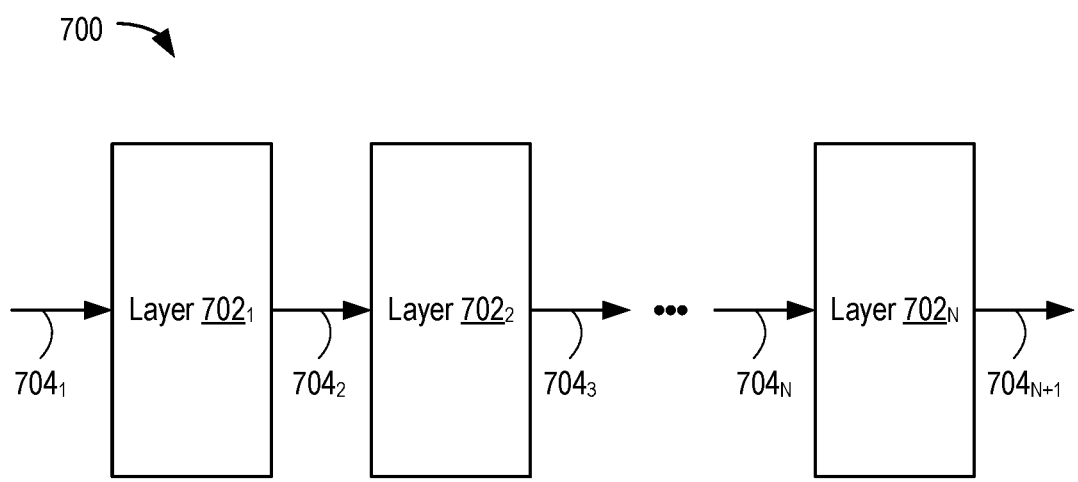
FIG. 7 is a block diagram depicting a neural network according to an example.

FIG. 7 is a block diagram depicting a neural network 700 according to an example. The neural network 700 includes a plurality of layers 702, e.g., layers $702_1 \ldots 702_N$, where N is an integer greater than zero. Each layer 702 has an input and an output. The layer $702_1$ has an input $704_1$ and an output $704_2$. The input to the layer $702_2$ is the output $704_2$ of the layer $702_1$. The layer $702_2$ includes an output $704_3$. An output of a layer $702_{N-1}$ (not shown) is the input of the layer $702_N$. The layer $702_N$ includes an output $704_{N+1}$. Thus, the input of the neural network 700 is the input $704_1$ and the output of the neural network is the layer $704_{N+1}$. In an example, one or more of the layers 702 is a convolutional layer. Each convolutional layer can include further post-processing (not shown) of its output, such as ReLU, max pooling, scaling, or the like. The convolution operations for a convolutional layer are implemented by the processor 606. The input to a convolutional layer is formatted by the image preprocessor 604.

Figure 8:
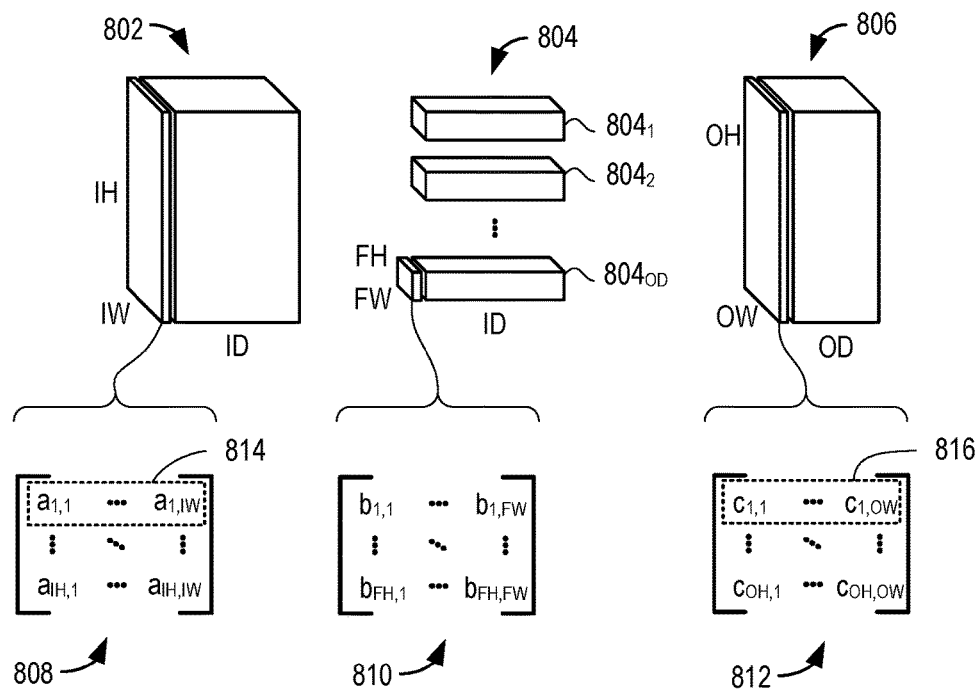
FIG. 8 illustrates input image data, filter data, and output image data for a convolution operation according to an example.

FIG. 8 illustrates input image data 802, filter data 804, and output image data 806 for a convolution operation according to an example. The convolution operation can be performed for a particular layer of a CNN, for example. The input image data 802 includes two-dimensional images, each having a width (IW) and a height (IH), for each of a number of channels (ID). Thus, the input image data 802 comprises an IW×IH×ID volume of image samples. For example, the input image data 802 can include 227×227 images in each of red, green, and blue (RGB) channels (e.g., 227×227×3). In another example, an inner convolutional layer of a CNN can include input image data with dimensions 55×55×96 (e.g., 96 channels each having a 55×55 image). Each image 808 can be represented by a two-dimensional matrix $A=(a_{ij})_{IH \times IW}$. Each image 808 includes an IH number of rows 814. As described below, the image preprocessor 604 processes an image 808 on a row-by-row basis.

In some cases, each image 808 can be padded with columns of zero-value samples on the left and right edges and/or rows of zero-value samples on the top and bottom edges. Padding is represented by numbers PH and PW, where PH is padding height and PW is padding width. For example, PH=PW=0 is no padding; PH=PW=1 means a ring of zero-value samples surrounds the image samples; PH=1 means that one row of zero-value samples is added to the top edge and another row of zero-value samples is added to the bottom edge; and PW=2 means that two columns of zero-value samples are added to the right edge and another two columns of zero-value samples are added to the left edge.

The filter data 804 includes three-dimensional filters $804_1 \ldots 804_{OD}$, each having a width (FW), a height (FH), and the depth (ID). The terms "filter" and "kernel" are used interchangeably herein. Each three-dimensional filter $804_1 \ldots 804_{OD}$ is convolved with the input image data 802 to generate a respective channel of the output image data 806. Thus, the number of three-dimensional filters $804_1 \ldots 804_{OD}$ equals the depth (OD) of the output image. Also, the depth of each three-dimensional filter $804_1 \ldots 804_{OD}$ matches the depth (ID) of the input image data 802. For example, a convolutional layer of a CNN can include 96 three-dimensional filters having dimensions of 11×11×3. Each two-dimensional cross-section of a filter $804_1 \ldots 804_{OD}$ can be represented by a two-dimensional matrix $B=(b_{ij})_{FH \times FW}$.

The output image data 806 includes two-dimensional images, each having a width (OW) and a height (IH), for a number (OD) of channels. Thus, the output image data 806 forms an OW×OH×OD volume. For example, the output image data 806 can include 96 channels each having a 55×55 image. Each image 816 can be represented by a two-dimensional matrix $C=(c_{ij})_{OH \times OW}$. Each image 816 includes an OH number of rows 816.

The values of OH and OW depend on the filter dimensions (FH, FW), input image padding (PH, PW), horizontal stride ($S_h$), vertical stride ($S_v$), horizontal dilation ($D_h$), and vertical dilation ($D_v$). Notably, $$OH = \left\lfloor \frac{IH + 2 \cdot PH - ((D_v + 1) \cdot (FH - 1) + 1)}{S_v} \right\rfloor + 1 \text{ and}$$

$$OW = \left\lfloor \frac{IW + 2 \cdot PW - ((D_h - 1) \cdot (FW - 1) + 1)}{S_h} \right\rfloor + 1.$$

To ensure that the entire image is processed, the expression $(IH+2PH-((D_v+1)(FH-1)+1))$ should evaluate to be a multiple of $S_v$ and the expression $(IW+2PW-((D_h+1)(FW-1)+1))$ should evaluate to be a multiple of $S_h$.

An output sample in an output image 812 depends on a neighborhood of input samples in each input image 808 referred to herein as a "receptive field." Each receptive field includes FH×FW input samples. A given output sample $c_{ij}$ in the output image 812 is computed by taking the dot product between vector of its receptive fields and a vector of given filter. Thus, the receptive fields of a given output sample $c_{ij}$ include a volume of input samples equal to ID×FH×FW samples. The size of the receptive fields depends on the filter dimensions (FH, FW). The input samples of the receptive fields and the extent to which the receptive fields overlap one another depend on the stride and dilation parameters of the convolution and the padding of the input image data.

Figure 9:
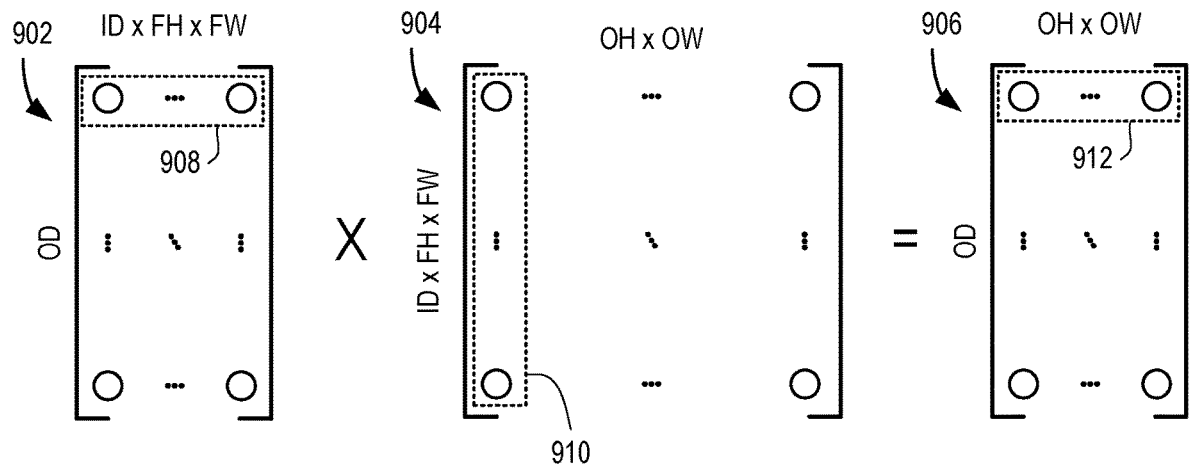
FIG. 9 illustrates convolution in terms of a two-dimensional matrix multiplication operation.

FIG. 9 illustrates convolution in terms of a two-dimensional matrix multiplication operation. A filter matrix 902 has an OD number of rows and an (ID×FH×FW) number of columns. In the filter matrix 902, each of the filters $804_1 \ldots 804_{OD}$ is converted into a vector having an (ID×FH×FW) number of elements. Each "vectorized" filter becomes a row 908 of the filter matrix 902.

An output image matrix 906 has an OD number of rows and an (OH×OW) number of columns. Each row 912 of the output image matrix 906 is a vectorized form of an output image 812. The output image matrix 906 includes an OD number of rows representing an OD number of channels of the output image data 806.

An input image matrix 904 has ID×FH×FW number of rows and OH×OW number of columns. The input image matrix 904 is formed so that each column 910 includes the receptive fields for a given output sample. Thus, the input image matrix 904 depends on filter size (FH, FW) and padding (PH, PW), as well as stride and dilation selected for the convolution.

In one technique, a processor can perform convolution by generating the matrices 902, 904, and 906 and performing the matrix multiplication operation. However, such a technique requires generation of the large input image matrix 904 using an image-to-column (IM2COL) process. The input image matrix 904 includes redundant data (e.g., image samples are repeated across the columns according to a particular pattern according to the defined overlap of receptive fields). For example, consider an input image data having 227×227×3 image samples (e.g., RGB image having height and width of 227 pixels each without padding). Assume further an 11×11×3 filter and a stride of four. In such an example, the input image data 802 includes 154,587 image samples, but the input image matrix 904 includes 1,098,075 image samples. If each image sample is one byte, generation of the input image matrix 904 requires approximately 1 MB of temporary storage. Of course, larger input sample sizes require even more temporary storage. Furthermore, computation of the input image matrix 904 requires complete traversal of the input image data 802 prior to performing the convolution operation. As described further herein, the image preprocessor 604 avoids the need to compute the input image matrix 904 and thus requires significantly less memory resources. Further, the image preprocessor 604 formats the input image data 802 in parallel with computation of the convolution.

Figure 10:
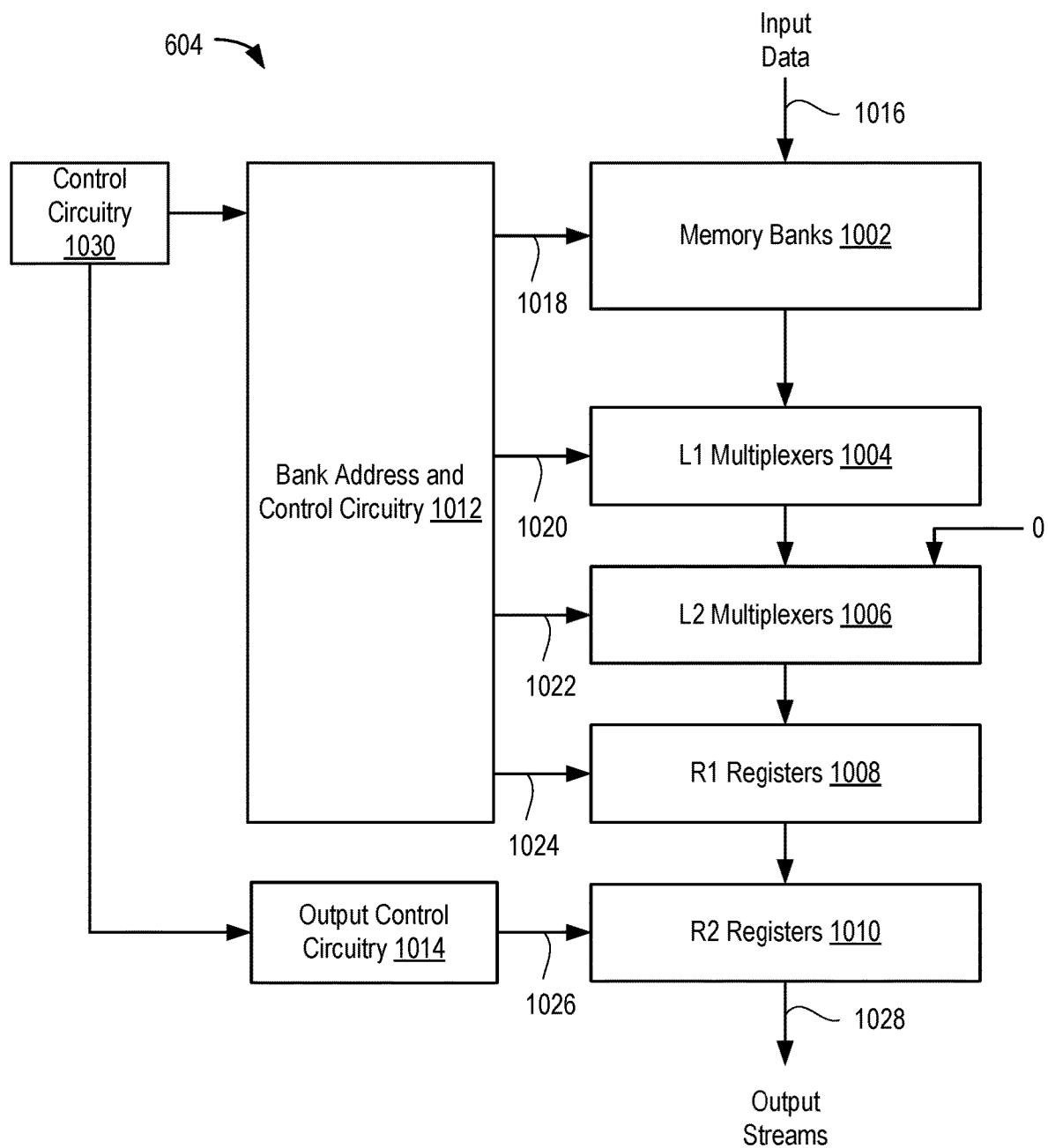
FIG. 10 is a block diagram depicting an image preprocessor according to an example.

FIG. 10 is a block diagram depicting the image preprocessor 604 according to an example. The image preprocessor 604 includes a plurality of memory banks 1002, a plurality of multiplexers 1004 (referred to as L1 multiplexers 1004), a plurality of multiplexers 1006 (referred to as L2 multiplexers 1006), a plurality of registers 1008 (referred to as R1 registers 1008), a plurality of registers 1010 (referred to as R2 registers 1010), bank address and control circuitry 1012, output control circuitry 1014, and control circuitry 1030. An input 1016 of the image preprocessor 604 is coupled to an input of the memory banks 1002. An output of the memory banks 1002 is coupled to an input of the L1 multiplexers 1004. An output of the L1 multiplexers is coupled to an input of the L2 multiplexers 1006. An output of the L2 multiplexers is coupled to an input of the R1 registers 1008. An output of the R1 registers is coupled to an input of the R2 registers. An output of the R2 registers is coupled to an output 1028 of the image preprocessor 604.

The bank address and control circuitry 1012 includes an output 1018 coupled to a control input of the memory banks 1002, an output 1020 coupled to a control input of the L1 multiplexers 1004, an output 1022 coupled to a control input of the L2 multiplexers 1006, and an output 1024 coupled to a control input of the R1 registers 1008. The output control circuitry 1014 includes an output 1026 coupled to a control input of the R2 registers 1010. The control circuitry 1030 includes an output coupled to an input of the bank address and control circuitry 1012 and an input of the output control circuitry 1014.

In operation, image data (also referred to as feature map data) is stored in the memory banks 1002. The memory banks 1002 can be implemented using multiple random access memories (RAMs) each referred to as a "bank" of memory. The collective size of the memory banks 1002 can be the maximum size of the image data to be stored for a given neural network. The width of each memory bank 1002 is the same size of the image data (e.g., 8 bits, 16 bits, 32 bits, etc.). The assignment of image data across the memory banks 1002 is described further below.

The L1 multiplexers 1004 select among the outputs of the memory banks 1002. Each L1 multiplexer 1004 includes inputs coupled to the respective outputs of the memory banks 1002. Thus, each L1 multiplexer 1004 can select an output of any of the memory banks 1002. The L2 multiplexers 1006 select among the outputs of the L1 multiplexers 1004 and a "0" value. Each L2 multiplexer 1004 selects between a respective output of a respective L1 multiplexer 1004 and the zero value. The width of each L1 multiplexer 1004 and each L2 multiplexer 1006 is the same as the width of a memory bank 1002.

The R1 registers 1008 store the output of the L2 multiplexers 1006 or hold the previous value based on an enable. Each R1 register 1008 stores a respective output of a respective L2 multiplexer 1006 selectively based on a respective enable signal. The R2 registers 1010 store the outputs of the R1 registers 1008 based on a clock signal. Each R2 1010 register stores a respective output of a respective R1 register 1008 based on the clock signal. The width of each R1 register 1008 and each R2 register 1010 is the same as the width of a memory bank 1002.

The bank address and control circuitry 1012 comprises memory (e.g., RAM) that stores control tuples {bank read address, L1 mux control, L2 mux control, R1 enable} for each memory bank 1002, each L1 multiplexer 1004, each L2 multiplexer 1006, and each R1 register 1008. The output control circuitry 1014 comprises memory (e.g., RAM) that stores control data for each R2 register 1010 that determines whether the R2 registers 1010 latch the output of the respective R1 registers. The control circuitry 1030 controls the bank address and control circuitry 1012 and the output control circuitry 1014 to cycle through the control data from one cycle to another.

Figure 11:
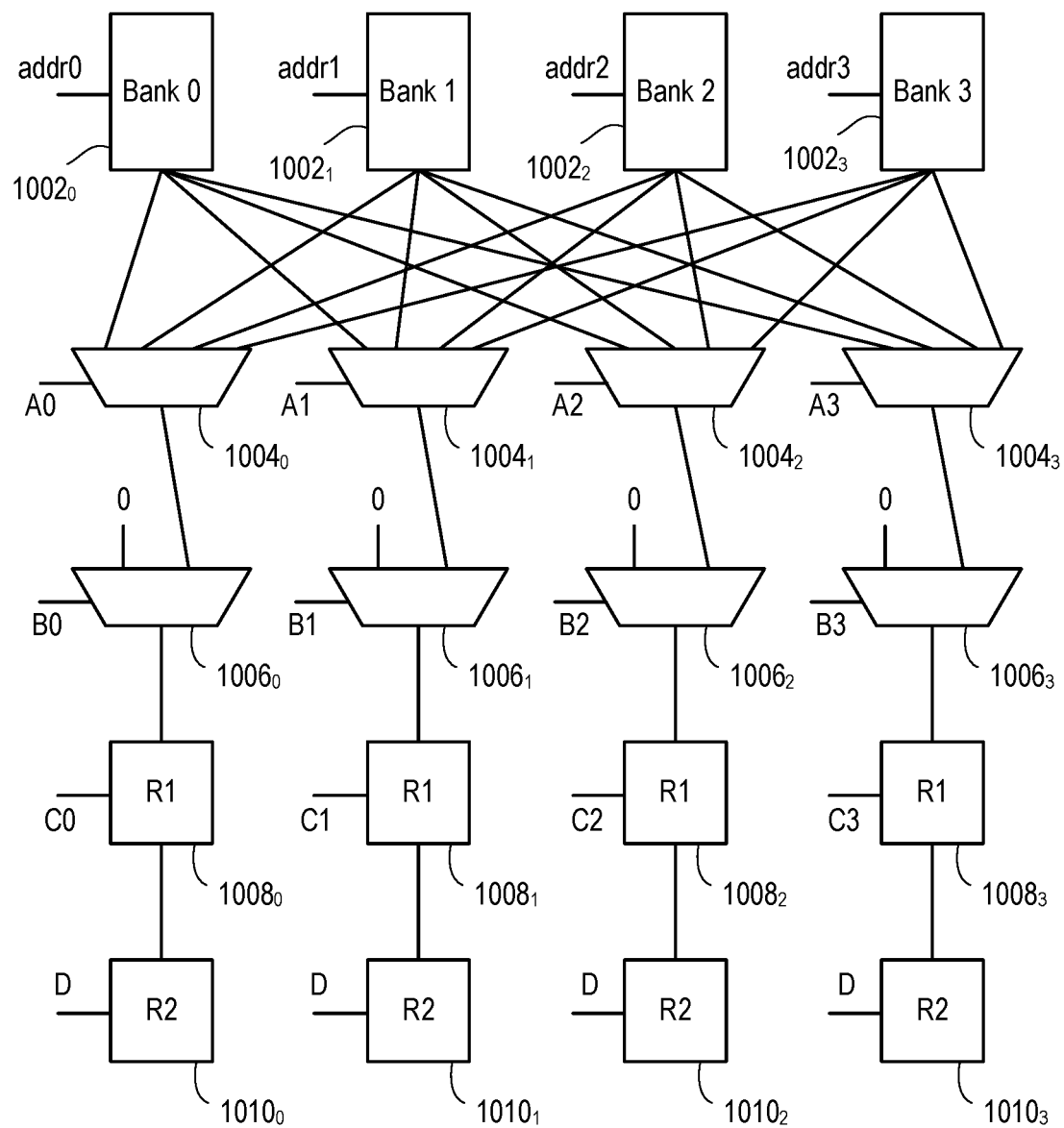
FIG. 11 is a block diagram depicting an example of the image preprocessor shown in FIG. 10.

FIG. 11 is a block diagram depicting an example of the image preprocessor 604 shown in FIG. 10. In the present example, the memory banks 1002 include four memory banks $1002_0 \ldots 1002_3$, the L1 multiplexers 1004 include four L1 multiplexers $1004_0 \ldots 1004_3$, the L2 multiplexers include four L2 multiplexers $1006_0 \ldots 1006_3$, the R1 registers include four R1 registers $1008_0 \ldots 1008_1$, and the R2 registers 1010 include four R2 registers $1010_0 \ldots 1010_3$. The bank address and control circuitry 1012 includes four bank address and control circuits $1012_0 \ldots 1012_3$.

Each of the L1 multiplexers $1004_0 \ldots 1004_3$ has four inputs respectively coupled to the four outputs of the memory banks $1002_0 \ldots 1002_3$. Each of the L2 multiplexers $1006_0 \ldots 1006_3$ includes two inputs, one of which is respectively coupled to an output of a respective L1 multiplexer $1004_0 \ldots 1004_3$. The other input of each L2 multiplexer $1006_0 \ldots 1006_3$ is coupled to receive a zero value. An input of each R1 register $1008_0 \ldots 1008_3$ is coupled to an output of a respective L2 multiplexer $1006_0 \ldots 1006_3$. An input of each R2 register $1010_0 \ldots 1010_3$ is coupled to an output of a respective R1 register $1008_0 \ldots 1008_3$. The bank address and control circuits $1012_0 \ldots 1012_3$ output control tuples {addr0, A0, B0, C0} . . . {addr3, A3, B3, C3}, respectively. The signals addr0 . . . addr3 are coupled to address inputs of the banks $1002_0 \ldots 1002_3$, respectively. The signals A0 . . . A3 are coupled to the control inputs of the L1 multiplexers $1004_0 \ldots 1004_3$, respectively. The signals B0 . . . B3 are coupled to control inputs of the L2 multiplexers $1006_0 \ldots 1006_3$, respectively. The signals C0 . . . C3 are coupled to control inputs of the R1 registers $1008_0 \ldots 1008_3$, respectively. The output control circuitry 1014 outputs a control signal D, which is coupled to the control input of each of the R2 registers $1010_0 \ldots 1010_3$.

In operation, each bank and address control circuit $1012_0 \ldots 1012_3$ outputs a particular control tuple for each of a plurality of cycles. Likewise, the output control circuitry 1014 outputs a particular value of the control signal D for each of the plurality of cycles. Over the plurality of cycles, the image preprocessor 604 reads from the memory banks $1002_0 \ldots 1002_3$ to generate four streams of image data output by the R2 registers $1010_0 \ldots 1010_3$. Operation of the image preprocessor 604 is described further below.

The software flow for the image preprocessor 604 can be understood with respect to the following example. FIG. 12 depicts a table 1200 representing addresses of a 2D image according to an example. Each cell of the table 1200 includes an address (x,y), where x∈[0,4] and y∈[0,4] (e.g., a 5×5 image). FIG. 13 depicts a table 1300 representing addresses of the image data transformed according to an image-to-column (im2col) operation according to an example. The table 1300 is a 9×9 array formed from the table 1200 using a 3×3 kernel, a stride of one, and no dilation. FIG. 14 depicts a table 1400 showing the image stored in the memory banks $1002_0 \ldots 1002_3$ according to an example. As shown in the table 1400, the memory bank $1002_0$ stores the image values at addresses (0,0), (0,4), (1,3), (2,2), (3,1), (4,0), and (4,4). The memory bank $1002_1$ stores the image values at addresses (0,1), (1,0), (1,4), (2,3), (3,2), (4,1), and a zero value (0) (e.g., padding). The memory bank $1002_2$ stores the image values at addresses (0,2), (1,1), (2,0), (2,4), (3,3), (4,2), and a zero value (0). The memory bank $1002_3$ stores the image values at addresses (0,3), (1,2), (2,1), (3,0), (3,4), (4,3), and a zero value (0).

Figure 15:
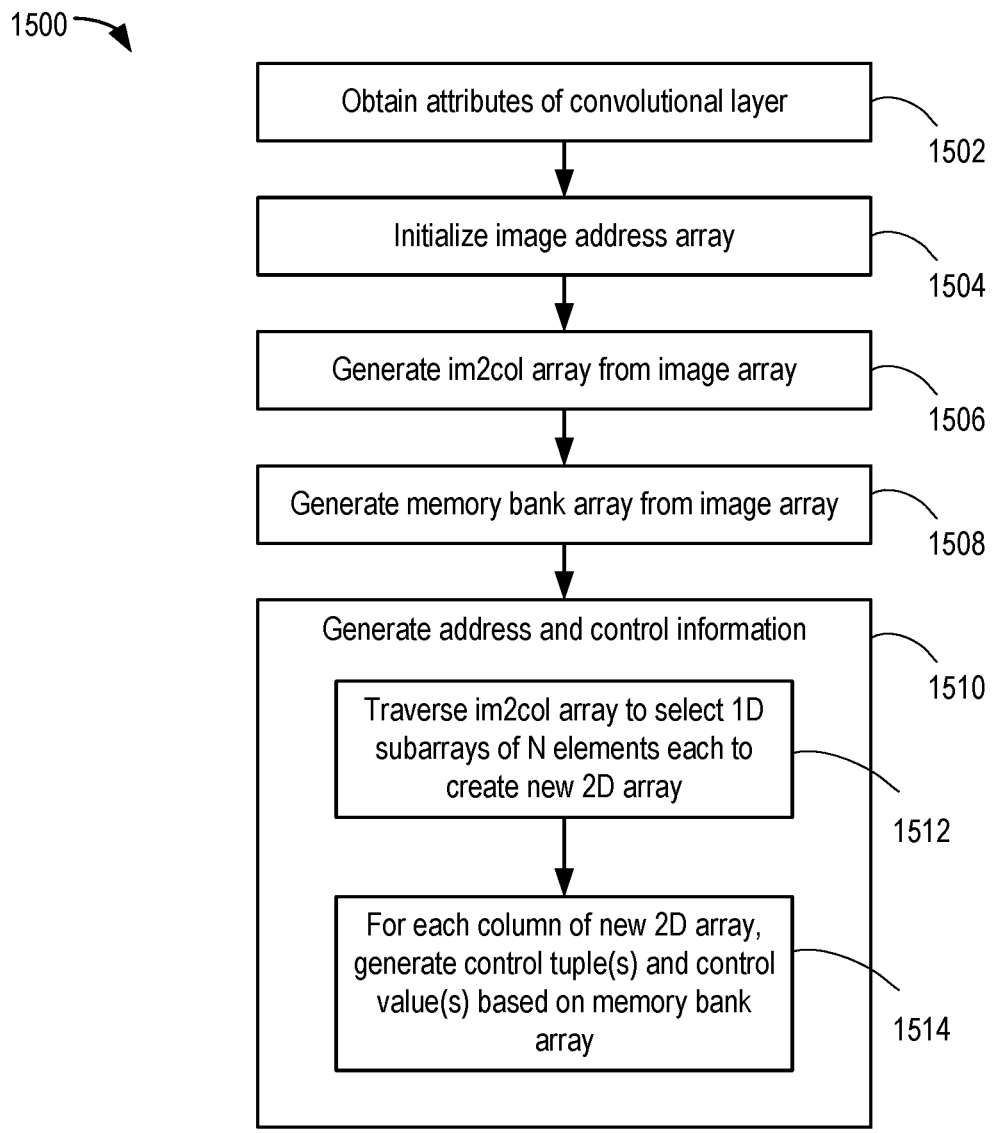
FIG. 15 is a flow diagram depicting a method for initializing an image preprocessor according to an example.

FIG. 15 is a flow diagram depicting a method 1500 for initializing the image preprocessor 604 according to an example. The method 1500 generates initial values for storage in the memory banks 1002. The method 1500 also generates initial values for storage in the bank address and control circuitry 1012. The method 1500 also generates initial values for storage in the output control circuitry 1014. The method 1500 may be performed by the design tool(s) 104 executing in the computer system 102 when generating configuration data for configuring the hardware accelerator(s) 116. In another example, the method 1500 can be performed by applications 112 or acceleration libraries 114 executing on the computer system(s) 108 for loading into the hardware accelerators 116.

The method 1500 begins at step 1502, where software obtains attributes of a convolutional layer. In an example, the convolutional layer attributes include image height, image width, kernel height, kernel width, stride, and padding. At step 1504, the software initializes a 2D array to contain addresses of the image data (e.g., the table 1200). At step 1506, the software performs an image-to-column transformation of the 2D array to generate an im2col array (e.g., the table 1300). At step 1508, the software generates a 2D array with appropriate padding representing storage of the image data across the memory banks 1002 (e.g., the table 1400).

At step 1510, the software generates address and control information based on the im2col array and the memory bank array. The address and control information includes control tuples for the bank address and control circuitry 1012 and control values for the output control circuitry 1014 over a plurality of cycles. In sub-step 1512, the software traverses the im2col array to select a one dimensional subarray of N elements at a time to create a new 2D array. There are different ways to select the one dimensional subarrays. For example, the subarrays can be selected from the im2col array vertically as groups of N (e.g., groups of 4) or horizontally as groups of N (e.g., groups of 4), with zero padding as needed. At sub-step 1514, for each column from the new 2D array formed in step 1512, and based on the memory bank array generated in step 1506, the software generates one or more control tuples {addr, A, B, C} for each memory bank 1002 and one or more control values D.

Step 1510 can be understood with respect to the following example. FIG. 16 depicts a 1D subarray 1600 selected at sub-step 1512 from the im2col array. In the example, the subarray 1600 includes image values at addresses (0,0), (0,1), (0,2), and (1,0) (e.g., the first 4-element sub-row of the table 1300). FIG. 17 depicts a table 1700 showing control information generated based on the subarray 1600 and the image array (e.g., table 1400). In the example, the selected sub-array 1600 translates into two control cycles. Thus, there are two control tuples {addr, A, B, C} and two control values D. The first row of the table 1700 shows the first control tuple and first control value, and the second row of the table 1700 shows the second control tuple and the second control value. The first column of the table 1700 represents control tuples for bank 0 (e.g., to be stored in bank address and control circuit $1012_0$); the second column of the table 1700 represents control tuples for bank 1 (e.g., to be stored in bank address and control circuit $1012_1$); the third column of the table 1700 represents control tuples for bank 2 (e.g., to be stored in bank address and control circuit $1012_2$); the fourth column of the table 1700 represents control tuples for bank 3 (e.g., to be stored in bank address and control circuit $1012_3$); and the fifth column of the table 1700 represents control values to be stored in the output control circuitry 1014.

As shown in the table 1700, the bank address and control circuit $1012_0$ stores control tuples {0,0,1,1} and {-,-,-,0} for the two cycles, where '-' represents a "don't care" value. The control tuple {0,0,1,1} includes the first address in bank 0 (addr=0), selects bank 0 at the L1 multiplexer $1004_0$, selects the output of the L1 multiplexer $1004_0$ at the L2 multiplexer $1006_0$, and enables the R1 register $1008_0$ to store the output of the L2 multiplexer $1006_0$. The control tuple {-,-,-,0} disables the R1 register $1008_0$ and thus the values of addr0, A0, and B0 can be any value. The control signal D is de-asserted in the first cycle and asserted in the second cycle. Thus, after the first cycle, the R1 register $1008_0$ stores the image value at the address (0,0), which is then loaded into the R2 register $1010_0$ in the second cycle.

For bank 1, the control tuple {0,1,1,1} includes the first address in bank 1 (addr=0), selects bank 1 at the L1 multiplexer $1004_1$, selects the output of the L1 multiplexer $1004_1$ at the L2 multiplexer $1006_1$, and enables the R1 register $1008_1$ to store the output of the L2 multiplexer $1006_1$. After the first cycle, the R1 register $1008_1$ stores the image value at the address (0,1). In the second cycle, the control tuple is {1,1,1,1}. Thus, the control tuple includes the second address in bank 1 (addr=1), selects bank 1 at the L1 multiplexer $1004_1$, selects the output of the L1 multiplexer $1004_1$ at the L2 multiplexer $1006_1$, and enables the R1 register $1008_1$ to store the output of the L2 multiplexer $1006_1$. After the second cycle, the R2 register $1010_1$ stores the image value at the address (0,1) and the R1 register stores the image value at the address (1,0).

The bank address and control circuit $1012_2$ stores control tuples {0,2,1,1} and for the two cycles, where '-' represents a "don't care" value. The control tuple {0,2,1,1} includes the first address in bank 2 (addr=0), selects bank 2 at the L1 multiplexer $1004_2$, selects the output of the L1 multiplexer $1004_2$ at the L2 multiplexer $1006_2$, and enables the R1 register $1008_2$ to store the output of the L2 multiplexer $1006_2$. The control tuple {-,-,-,0} disables the R1 register $1008_2$ and thus the values of addr0, A0, and B0 can be any value. The control signal D is de-asserted in the first cycle and asserted in the second cycle. Thus, after the first cycle, the R1 register $1008_2$ stores the image value at the address (0,2), which is then loaded into the R2 register $1010_2$ in the second cycle.

The bank address and control circuit $1012_3$ stores control tuples {-,-,-,0} for each of the two cycles. Thus, the R1 register $1008_3$ is disabled for both cycles and the values of addr3, A3, and B3 can be any value. After the second cycle, the R2 register $1010_3$ stores the value stored in the R1 register $1008_3$.

Figure 18:
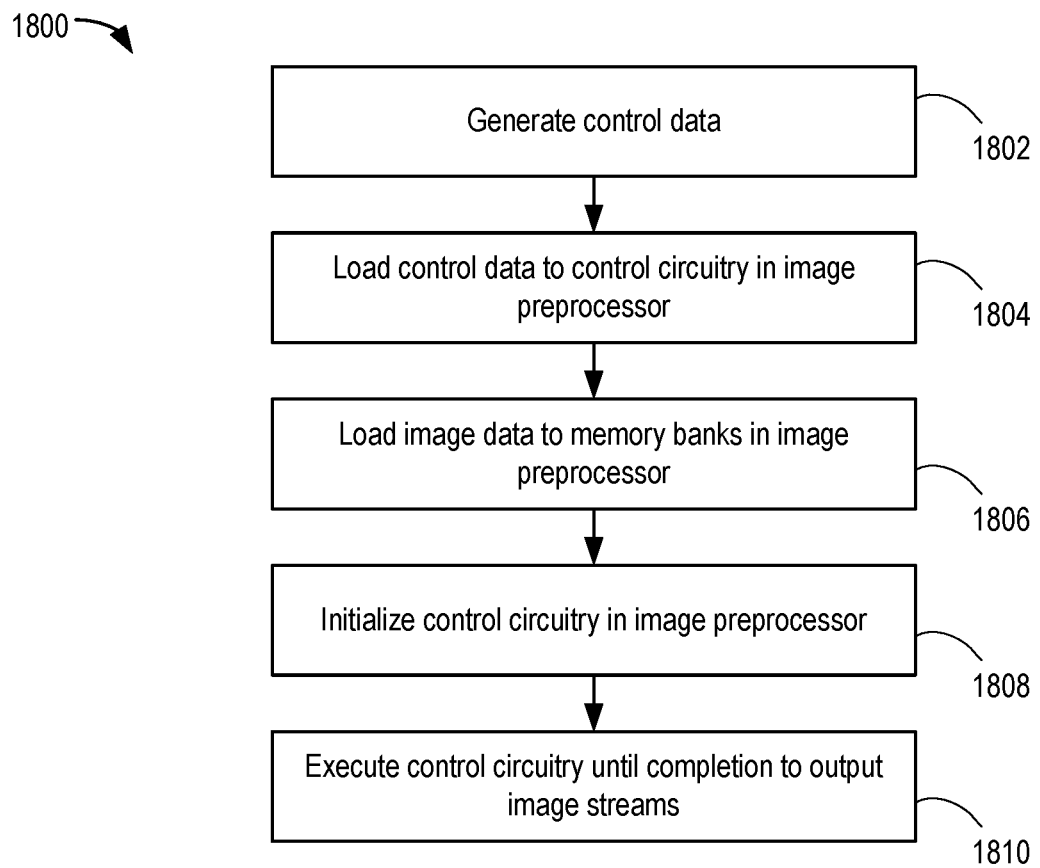
FIG. 18 is a flow diagram depicting a method of operating an image preprocessor according to an example.

FIG. 18 is a flow diagram depicting a method 1800 of operating the image preprocessor 604 according to an example. The method 1800 begins at step 1802, where software is executed on a computer system to generate the control data. For example, the method 1500 described above is performed to generate the control data for the image preprocessor 604. At step 1804, the control data is loaded to the control circuitry in the image preprocessor 604 (e.g., control tuples to the bank address and control circuitry 1012 and control values to the output control circuitry 1014). At step 1806, image data is loaded to the memory banks in the image preprocessor 604. At step 1808, the control circuitry in the image preprocessor 604 is initialized. At step 1810, the control circuitry is executed until completion to output the image streams.

While the foregoing is directed to specific examples, other and further examples may be devised without departing from the basic scope thereof, and the scope thereof is determined by the claims that follow.

What is claimed is:

1. A preprocessor circuit for formatting image data into a plurality of streams of image samples, the preprocessor circuit comprising:
   a plurality of memory banks configured to store the image data;
   multiplexer circuitry coupled to the memory banks;
   a first plurality of registers coupled to the multiplexer circuitry;
   a second plurality of registers coupled to the first plurality of registers, outputs of the second plurality of registers configured to provide the plurality of streams of image samples;
   bank address and control circuitry coupled to control inputs of the plurality of memory banks, the multiplexer circuitry, and the first plurality of registers;
   output control circuitry coupled to control inputs of the second plurality of registers; and a control state machine coupled to the bank address and control circuitry and the output control circuitry;

wherein the preprocessor circuit is configured to generate the plurality of streams of image samples from output of the second plurality of registers.

2. The preprocessor circuit of claim 1, wherein the bank address and control circuitry is configured to, based on output of the control state machine, generate addresses for the plurality of memory banks, control the multiplexer circuitry to select among outputs of the plurality of memory banks, and control the first plurality of registers to store outputs of the multiplexer circuitry.

3. The preprocessor circuit of claim 1, wherein the output control circuitry is configured to control the second plurality of registers to store outputs of the first plurality of registers based on output of the control state machine.

4. The preprocessor circuit of claim 1, wherein the multiplexer circuitry comprises:
a first plurality of multiplexers coupled to the memory banks; and
a second plurality of multiplexers coupled to outputs of the first plurality of multiplexers and to receive a zero value;
wherein the bank address and control circuitry is configured to control the first plurality of multiplexers to select among outputs of the plurality of memory banks, and control the second plurality of multiplexers to select between the outputs of the first plurality of multiplexers and the zero value.

5. The preprocessor circuit of claim 4, wherein the bank address and control circuitry is configured to store a sequence of control tuples, each control tuple including an address of a memory bank, a first control value for controlling a first multiplexer, a second control value for controlling a second multiplexer, and a third control value for enabling a first register.

6. The preprocessor circuit of claim 5, wherein the output control circuitry is configured to store control values each configured to enable or disable the second plurality of registers.

7. The preprocessor circuit of claim 1, wherein the bank address and control circuitry comprises:
a plurality of bank address and control circuits coupled to the respective plurality of memory banks.

8. An integrated circuit (IC), comprising:
a memory controller configured to access a memory having image data stored therein;
an image preprocessor, coupled to the memory controller, configured to obtain the image data and generate a plurality of streams of image samples from the image data; and
a processor, coupled to the image preprocessor, configured to process the plurality of streams of image samples;
wherein the image preprocessor includes:
a plurality of memory banks configured to store the image data;
multiplexer circuitry coupled to the plurality of memory banks;
a first plurality of registers coupled to the multiplexer circuitry;
a second plurality of registers coupled to the first plurality of registers, outputs of the second plurality of registers configured to provide the plurality of streams of image samples; and bank address and control circuitry coupled to control inputs of the plurality of memory banks, the multiplexer circuitry, and the first plurality of registers;
output control circuitry coupled to control inputs of the second plurality of registers; and
a control state machine coupled to the bank address and control circuitry and the output control circuitry;
wherein the image preprocessor is configured to generate the plurality of streams of image samples from output of the second plurality of registers.

9. The IC of claim 8, wherein the bank address and control circuitry is configured to, based on output of the control state machine, generate addresses for the plurality of memory banks, control the multiplexer circuitry to select among outputs of the plurality of memory banks, and control the first plurality of registers to store outputs of the multiplexer circuitry.

10. The IC of claim 8, wherein the output control circuitry is configured to control the second plurality of registers to store outputs of the first plurality of registers based on output of the control state machine.

11. The IC of claim 8, wherein the multiplexer circuitry comprises:
a first plurality of multiplexers coupled to the memory banks; and
a second plurality of multiplexers coupled to outputs of the first plurality of multiplexers and to receive a zero value;
wherein the bank address and control circuitry is configured to control the first plurality of multiplexers to select among outputs of the plurality of memory banks, and control the second plurality of multiplexers to select between the outputs of the first plurality of multiplexers and the zero value.

12. The IC of claim 11, wherein the bank address and control circuitry is configured to store a sequence of control tuples, each control tuple including an address of a memory bank, a first control value for controlling a first multiplexer, a second control value for controlling a second multiplexer, and a third control value for enabling a first register.

13. The IC of claim 12, wherein the output control circuitry is configured to store control values each configured to enable or disable the second plurality of registers.

14. The IC of claim 8, wherein the bank address and control circuitry comprises:
a plurality of bank address and control circuits coupled to the respective plurality of memory banks.

15. A method of controlling an image preprocessor that formats image data into a plurality of streams of image samples, the method comprising:
generating control data based on an input image size, a kernel size, a stride, and a padding value for a convolutional layer of a neural network;
loading image data to a plurality of memory banks of the image preprocessor;
loading the control data to a control state machine coupled to a bank address and control circuitry and an output control circuitry, the bank address and control circuitry coupled to control inputs of the plurality of memory banks, a first plurality of multiplexers, a second plurality of multiplexers, and a first plurality of registers, the output control circuitry coupled to control inputs of a second plurality of registers;
controlling, by the control state machine, the bank address and control circuitry to generate addresses for the plurality of memory banks, control multiplexer circuitry to select among outputs of the plurality of memory banks, control a first plurality of registers to store outputs of the multiplexer circuitry;

controlling, by the control state machine, the output control circuitry to control a second plurality of registers to store outputs of the first plurality of registers; and generating the plurality of streams of image samples from output of the second plurality of registers.

16. The method of claim 15, wherein the multiplexer circuitry comprises:
   a first plurality of multiplexers coupled to the memory banks; and
   a second plurality of multiplexers coupled to outputs of the first plurality of multiplexers and to receive a zero value;
   wherein the bank address and control circuitry is configured to control the first plurality of multiplexers to select among outputs of the plurality of memory banks, and control the second plurality of multiplexers to select between the outputs of the first plurality of multiplexers and the zero value.

17. The method of claim 16, wherein the bank address and control circuitry is configured to store a sequence of control tuples, each control tuple including an address of a memory bank, a first control value for controlling a first multiplexer, a second control value for controlling a second multiplexer, and a third control value for enabling a first register.

18. The method of claim 17, wherein the output control circuitry is configured to store control values each configured to enable or disable the second plurality of registers.

19. The method of claim 15, wherein the step of generating the control data comprises:
   initializing a first array based on the input image size;
   generating a second array from the first array using an image-to-column transformation;
   generating a third array from the first array based on the plurality of memory banks; and
   generating the control data based on the second array and the third array.

20. The method of claim 19, wherein the step of generating the control data based on the second array and the third array comprises:
   traversing the second array to select subarrays of elements to create a fourth array; and
   for each column of the fourth array, generating one or more control tuples and one or more control values based on the third array.

* * * * *